(12) United States Patent
Lopata et al.

(10) Patent No.: US 6,990,733 B2
(45) Date of Patent: Jan. 31, 2006

(54) METHOD OF MAKING STITCHED LGA CONNECTOR

(75) Inventors: John E. Lopata, Naperville, IL (US); James L. McGrath, Bloomingdale, IL (US); Arindum Dutta, Lisle, IL (US); Marvin Menzin, Lexington, MA (US); Daniel Fisher, Jr., Chelmsford, MA (US)

(73) Assignee: Molex Incorporated, Lisle, IL (US)

( * ) Notice: Subject to any disclaimer, the term of this patent is extended or adjusted under 35 U.S.C. 154(b) by 13 days.

(21) Appl. No.: 10/783,644

(22) Filed: Feb. 20, 2004

(65) Prior Publication Data

US 2004/0163250 A1    Aug. 26, 2004

Related U.S. Application Data

(63) Continuation of application No. 09/815,115, filed on Mar. 22, 2001, now Pat. No. 6,694,609.

(51) Int. Cl.
*H01R 9/09*    (2006.01)
*H01L 21/44*    (2006.01)

(52) U.S. Cl. .............................. 29/834; 29/835; 29/837; 29/841; 29/868; 29/883

(58) Field of Classification Search ................ 29/832, 29/834, 835, 837, 838, 841, 868, 882, 883; 228/180.21, 180.22; 257/737, 738, 778, 257/779, 780; 438/106, 108, 109, 125, 126, 438/612, 613, 118; 439/66, 74, 91, 59, 567
See application file for complete search history.

(56) References Cited

U.S. PATENT DOCUMENTS

| | | | | |
|---|---|---|---|---|
| 5,101,553 A | * | 4/1992 | Carey et al. | 29/882 |
| 5,232,372 A | * | 8/1993 | Bradley et al. | 439/66 |
| 6,365,499 B1 | * | 4/2002 | Nakamura et al. | 438/613 |

OTHER PUBLICATIONS

Preliminary Amendment in U.S. Appl. No. 10/702,299 copending and not yet examined.

* cited by examiner

*Primary Examiner*—Timothy V. Eley
(74) *Attorney, Agent, or Firm*—Thomas D. Paulius

(57) ABSTRACT

A land grid array connector is formed by attaching a reinforcing member to a frame and coating the reinforcing member with an elastomeric compound to form a reinforced, flexible body portion of the connector. Conductive wires are inserted in pairs in an array in the fabric extent. Free ends of the wires extend past the elastomeric compound to provide contacts of the connector. The pairs of wires provide redundancy for the contacts to ensure a reliable connection.

22 Claims, 9 Drawing Sheets

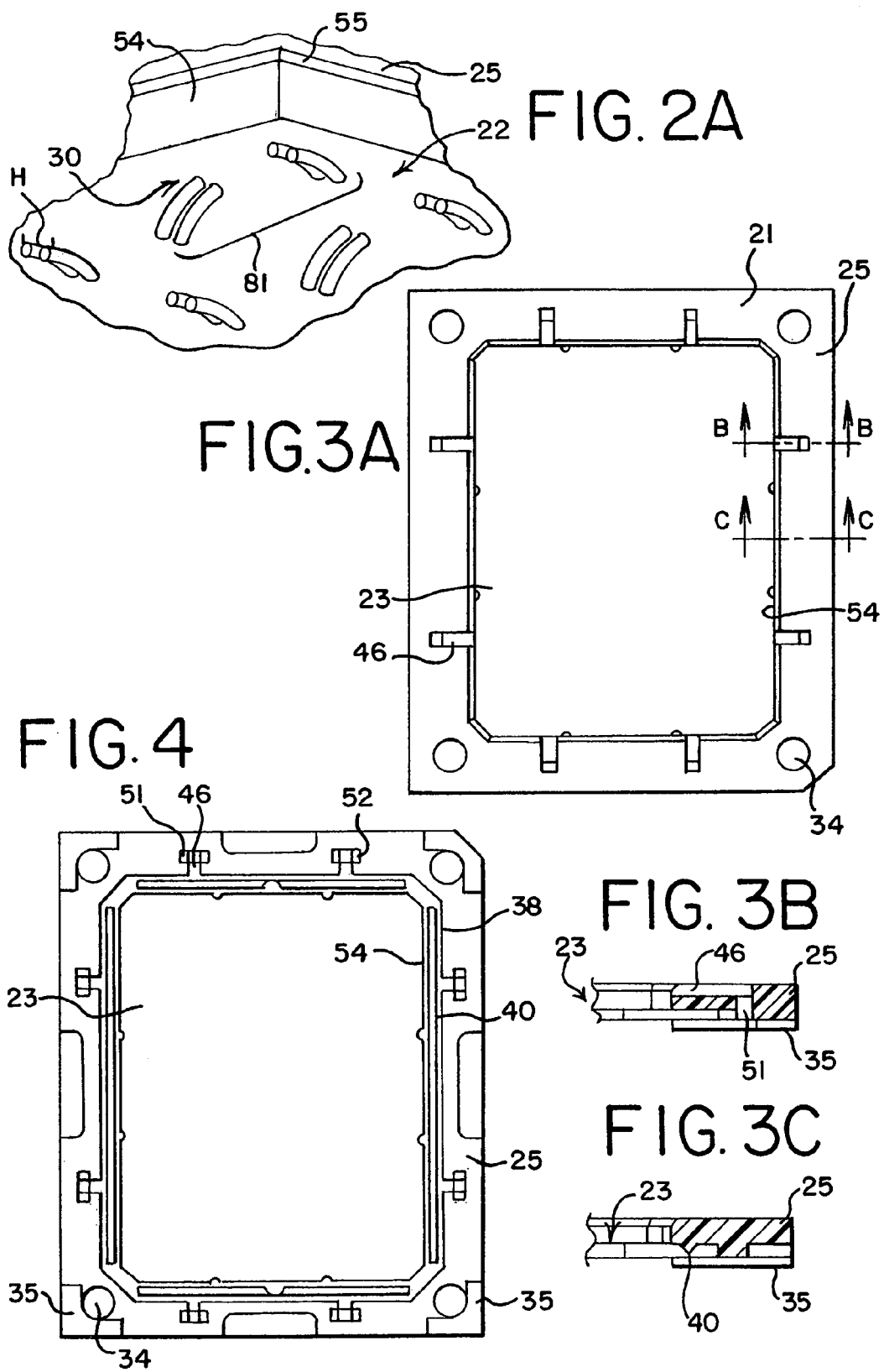

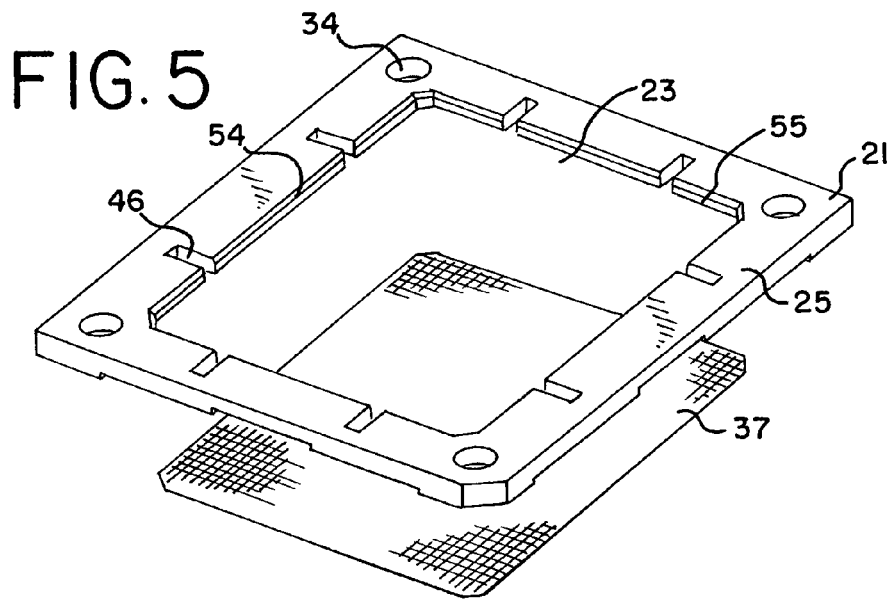
FIG. 5
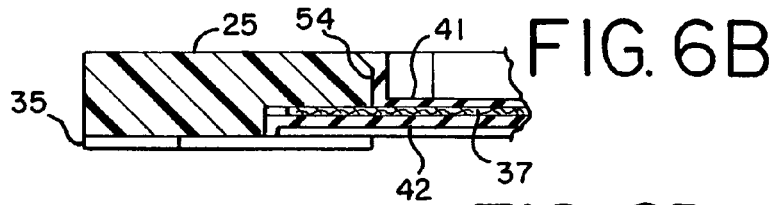
FIG. 6B
FIG. 6A
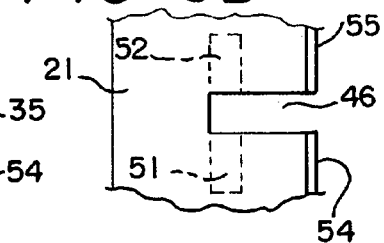
FIG. 6D
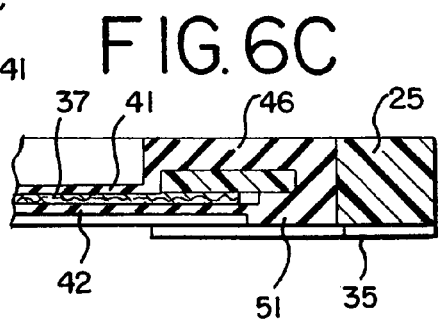
FIG. 6C
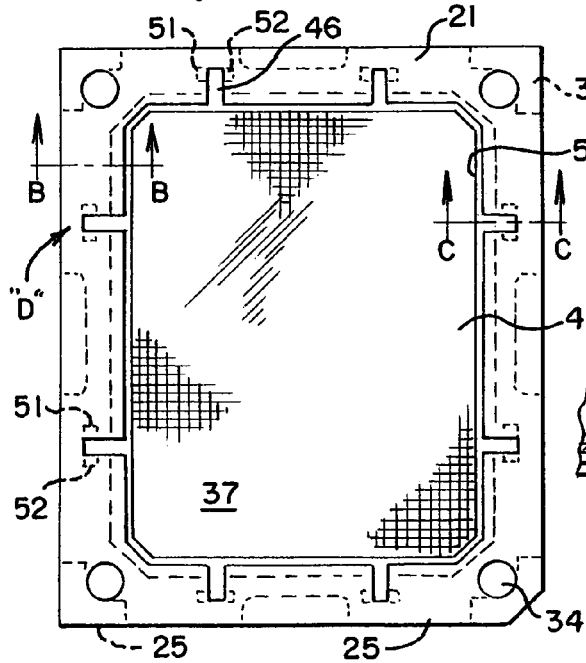

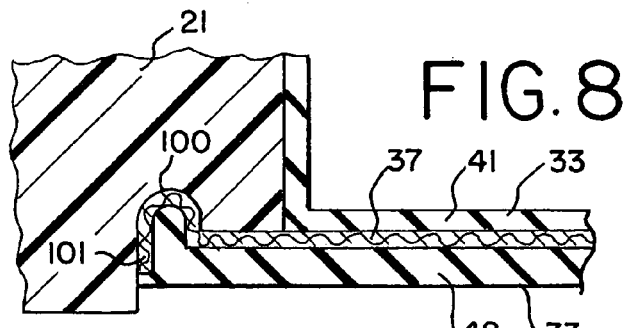
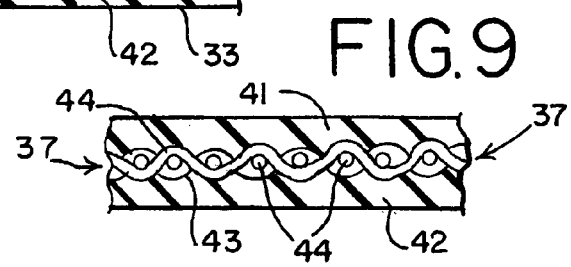
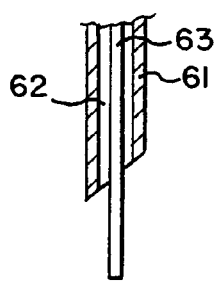
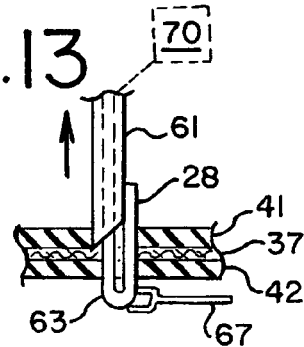
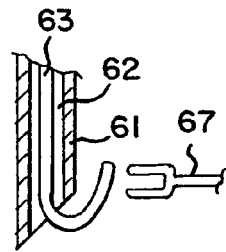
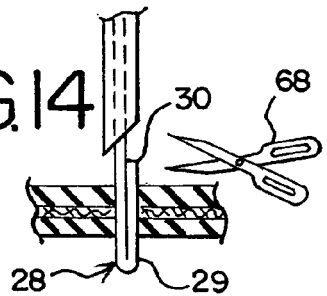
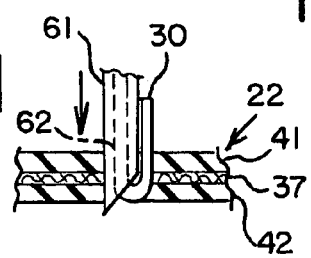
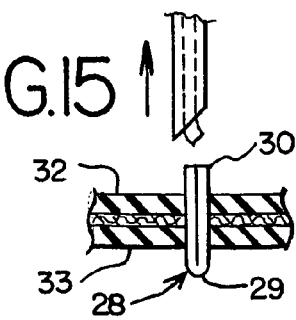
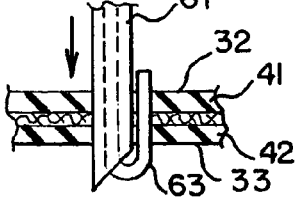

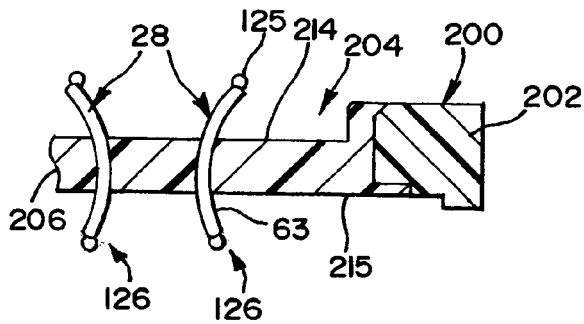
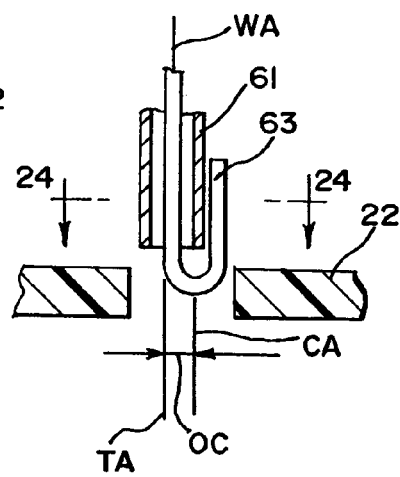
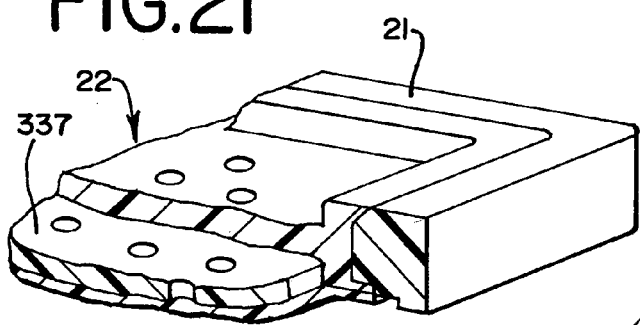
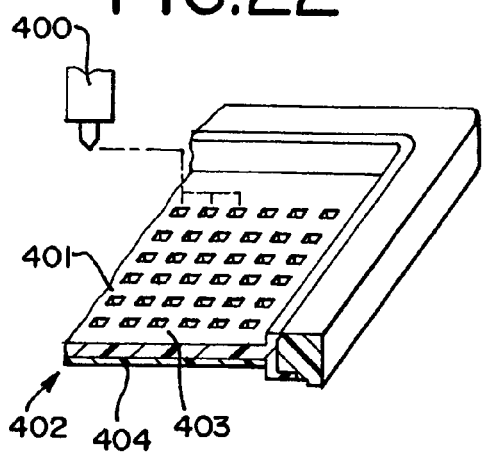
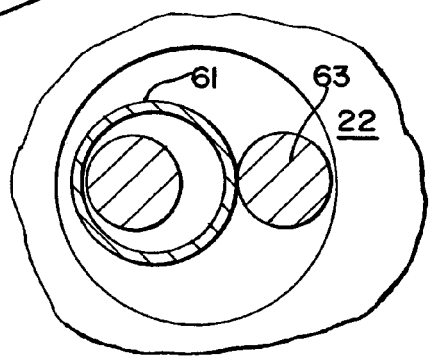
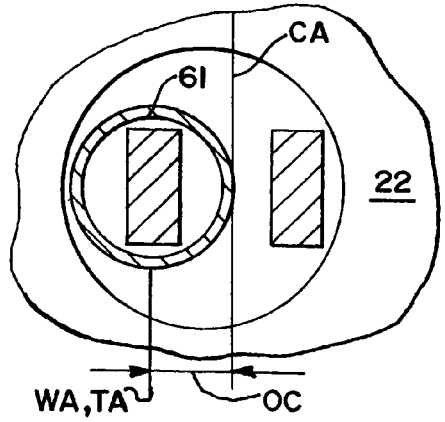

METHOD OF MAKING STITCHED LGA CONNECTOR

This application is a Continuation of Ser. No. 09/815,115 filed Mar. 22, 2001, now U.S. Pat. No. 6,694,609.

BACKGROUND OF THE INVENTION

The present invention relates generally to pressure contact connectors, and more particularly to a land grid array ("LGA") connector that uses a plurality of wires as contacts that are held in a flexible body portion of the connector.

The electronics industry has seen a large growth in the past few years of reduced size electronic devices and appliances, such as laptop computers and the like. The industry is always seeking to reduce the size of these components and to increase their functionality and capability. Both aims are accomplished by increasing the density of circuits on components of the device. Although the number of circuits established on a chip or circuit board may be increased, care must be taken to ensure that a reliable interconnection is established between the high density component and another component of the device.

These high-density interconnections are used for microprocessor, ASIC and other types of chips and may also be used to provide a connector between two circuit boards. Ball Grid Array ("BGA") packages have been used as high-density interconnections for these type applications. In BGA style packages, pads are formed in a substrate and small, spherical balls of solder are placed in contact with the pads. These balls are then heated to provide connections between the chip and another circuit board. However, these balls often exhibit poor circuit board compliance and mechanical properties in effecting contact between the chip and the opposing circuit board. They are not always suitable to overcome variations that may occur in the substrate printed circuit board. Additionally, once the balls are heated to provide solder connections, the chip cannot be easily removed to correct any defect in the soldering, without reworking all of the solder balls and reflowing the ball grid array to the printed circuit board in another attempt to provide a reliable connection. Thus, it can be appreciated that the use of a BGA solder package does not provide a separable device interface.

Land grid array (LGA) connectors have been developed for such applications and they provide circuit paths between the device and the circuit board involving the use of conductive leads, such as formed metal contacts, that are typically embedded in a rigid plastic substrate to connect lands, or pads on a printed circuit board to the solder balls, or lands, that may be formed on a chip or other device. These lands are formed in a particular pattern in opposition to the solder balls/lands of the component to which the connector is mated. These LGA connectors offer numerous advantages over BGA devices in that they provide to the circuit or system designer, a separable interface between the chip/chip package and a circuit board that BGA devices cannot provide because they are soldered to circuit boards to effect their connections. However, in LGA connectors, each conductive lead must exert a particular spring force that should be maintained in order to establish a reliable interconnection to a device. A clamping force must be exerted against a chip to retain it in contact with the connector. Chips having contacts in excess of 1000 contacts may require a contact force of well over a hundred pounds.

U.S. Pat. No. 4,998,885, issued Mar. 21, 1991 describes such a style of connector in which wires with ball-shaped end portions are embedded within an elastomeric pad. However, the elastomeric pad must be precisely scored to a controlled depth by a laser in the area between the wires in order to increase the flexibility of the wires and the ball-shaped end portions thereof. Cutting these lines too deep in the elastomeric pad presents a risk of weakening the elastomer that supports the wires and possibly create unreliable contacts, in that some of the wires may buckle and thereby not fulfill their individual resilient mating functions. This not only complicates the manufacture of, but also increases the cost of manufacture of such connectors The present invention is therefore directed to an improved LGA connector and method of making the connector that overcomes the aforementioned disadvantages.

SUMMARY OF THE INVENTION

Accordingly, it is a general object of the present invention to provide an LGA connector having a flexible body portion that supports a plurality of resiliently deformable contacts arranged in a high-density pattern so as to ensure a reliable connection between the connector and an opposing component or device.

Another object of the present invention is to provide a high density LGA connector having a resilient body portion that is reinforced by a reinforcement layer interposed between two elastomeric layers, and a plurality of contacts disposed in an array within the body portion, the contacts having free ends that extend above opposing surfaces of the body portion.

Another object of the present invention is to provide a reliable, high density LGA connector having a resilient body portion that is reinforced by a fabric extent interposed between two elastomeric layers, and a plurality of contacts disposed in an array within the body portion, the contacts having free ends that extend above opposing surfaces of the body portion.

Still another object of the present invention is to provide an LGA connector wherein the connector has a flexible body portion that supports a plurality of conductive wire contacts formed as flexible loops, having free ends that extending past opposing sides of the connector body portion.

Yet still another object of the present invention is to provide a pressure-activated connector having a fabric substrate encapsulated within an elastomer, the connector having a plurality of thin, resilient contacts disposed on the fabric substrate in a predetermined array and extending through the substrate, the contacts being formed as thin filaments of wire folded upon themselves into a dual-strand loop, the contacts having free ends that extend on opposite sides of the substrate.

A still further object of the present invention is to provide a LGA connector for high density applications, wherein the connector includes a frame that encompasses a central body portion, the body portion including at least one elastomeric extent that is reinforced by a reinforcement member at least partially embedded therein, the connector having a plurality of conductive contacts disposed in an array within the body portion, the contacts being formed from thin, conductive wires that are inserted into the central body portion, the contacts being formed as open loops that define interconnected, redundant circuit paths for each contact.

Yet still another object of the present invention is to provide a pressure-activated connector having a flexible body portion that is supported by a connector frame member, the frame member extending around the flexible body portion and defining the perimeter of the connector, the connector having at least one recess formed therein that forms a partial receptacle for a chip or chip package, and the flexible body portion including an elastomeric extent presented on at least one surface of the body portion, the elastomeric extent being reinforced by a fabric extent to which the elastomeric extent is attached, both of the elastomeric extent and the fabric extent having similar dimensions so as to impart uniform characteristics to the body portion throughout its entire area, and the connector including a plurality of conductive contacts that are inserted into the body portion of the connector, the contacts including conductive wire lengths that are stitched into the body portion, while bent upon themselves to thereby form two, adjacent and redundant circuit paths extending through the connector body portion, the contacts having free ends that project outwardly on opposite sides of the body portion for contacting two different electronic components, the contacts being supported by the body portion at approximately the mid-sections thereof.

Yet another object of the present invention is to provide a method for making an improved LGA conductor including the steps of: forming a pliable connector body portion by capturing a reinforcement member within an elastomer, supporting it on a support member, passing a length of conductive wire through center of a hollow insertion tool, stitching the length of wire into the connector body portion by moving the insertion tool into and out of penetrating contact with the body portion, while further cutting the wire after each such insertion so as to deposit a conductive wire in the body portion that has at least one free end that projects above a surface of the connector body portion.

A further object of the present invention is to provide a pressure-activated connector having a flexible body portion held within a rigid frame, the connector having a plurality of contacts embedded in the body portion, the contacts being inserted in the body portion as a pair of interconnected strands of conductive wire formed as open loops, each open loop having two free ends that extend past exterior, opposing surfaces of the connector body portion, the free end portions being angled sideways in an offset pattern matching the pattern of an opposing circuit component, the angling of the wires increasing the contact lengths thereof and presenting a knife edge to contact pads of opposing components.

Still a further object of the present invention is to provide an improved LGA connector having a flexible connector body portion formed from an elastomer, the body portion being supported on a frame and containing a plurality of individual conductive contacts, the contacts being formed as wire loops to provide a pair of redundant, conductive circuit paths in the connector body portion, the body portion having a plurality of openings each of which receives a wire loop therein, the wires that form the loop extending through the body portion on opposite sides of a centerline of the opening.

The present invention accomplishes these and other objects by way of its unique and novel structure.

In one principal aspect of the present invention and as exemplified by one embodiment thereof, the connector includes a flexible connector body portion that is supported in a tight outer frame. The flexible connector body portion utilizes a reinforcement member as a substrate, and to which an elastomer is applied. As exemplified by a first embodiment of the invention, the elastomer is positioned on both surfaces of a fabric extent that is used as the reinforcement member so that it preferably fills the interstices of the fabric to elastomer provides a self-sealing support surface on both sides of the fabric extent while the fabric extent provides reinforcement to the elastomer. The manner in which the elastomer attaches to the fabric extent may be an encapsulation, a lamination or layering.

Conventional fabrics may be used for the fabric extent, such as those which are woven in a conventional manner having warps and wefts (or fills) interlaced together, either in a uniform or staggered pattern, and it is contemplated that even non-woven fabrics, such as knitted fabrics, felts and the like may be used for reinforcement, provided that the elastomer used may bond or otherwise attach itself to the fabric extent in a manner to intimately contact the fabric extent and provide a resilient body as the connector body portion.

Thin wires are arranged in the connector body portion in a predetermined array and are inserted into the fabric substrate by passing them through a needle and inserting the needle in and out of the substrate so as to "stitch" the wire contacts in place in the connector body portion. The wires are bent upon themselves so that a contact is formed and inserted into the connector body portion that has the form of an open loop. The elastomer has a consistency sufficiently resilient to grab and hold the wires as they are stitched through the connector body portion, and the fabric extent has a consistency sufficient to provide reinforcement or a measure of rigidity to the elastomer.

In an alternate embodiment of the invention, the elastomer may be applied to only one surface of the reinforcement member. In still another embodiment of the present invention, the reinforcement member may utilize a solid sheet of film, preferably a polymer film, and most preferably a polyamide film such as that sold by E. I. DuPont under the trade name "Kapton". Such films have a desired durability and do not fray as fabrics may, and the holes for the wire contacts may be easily formed therein by a laser to "burn" them through the entire body portion of the connector.

In another principal aspect of the present invention, the contacts are formed by stitching pairs of wires into the substrate, the pairs being formed from single wire strands that are bent them upon themselves at one end thereof to form dual strand wire lengths, or open loops, with the strands having a bend formed therein at one end thereof, while having two ends of the wire spaced close together or adjacent one another at the other end of the contact, so that one free end of each contact preferably has a loop configuration while the other free end of the contact has the butt ends of two of the wire strands. The wires extend past the substrate in a predetermined distance sufficient to provide a plurality of resilient contact beams that flex under pressure of an opposing component, such as a chip, so that Hertzian contact occurs between the contacts and the opposing contact pads on the circuit board. The wires may be bent in a certain direction to define a deflection direction, rather than relying upon buckling of the wires to provide the movement under deflection. The dual nature of the wire strands, whether they have a circular or rectangular/square cross-section, provide each contact of the connector with redundant circuit paths.

In still another principal aspect of the present invention, a length of each wire is passed through the center of an insertion tool that takes the form of a hollow needle, or tube, and bent upon itself to form a loop prior to the needle making an insertion stroke through the connector body portion. The insertion tool is then withdrawn, leaving a double strand wire held in the connector body portion at approximately the mid-section of the strands so that the free ends of the contacts extend past the two opposite surfaces of the connector body portion for approximately the same length. At a preselected distance in the removal of the insertion tool, the wires are cut to form a dual strand, free end of the connector contact, so that a pair of conductive paths are established for each contact in a single insertion and removal stroke of the insertion tool, thereby providing the connector with redundancy and lower inductance.

In yet still another principal aspect of the present invention, the insertion tool is provided with a tip being formed so that the wire may exit from the center of the tool but from the side of the tip. This tool may have an angled tip with a single point, or it may have multiple points that are aligned with each other in order to balance the insertion force on the tool as it penetrates the elastomer and, if present, its reinforcement member.

In yet another principal aspect of the present invention, a plurality of holes may be formed in connector body such as by cutting them with a laser, slitting the body portion, or pre-punching the body portion to form the holes. Once formed, the contacts are inserted into the holes.

These and other objects, features and advantages of the present invention will be clearly understood through consideration of the following detailed description.

BRIEF DESCRIPTION OF THE DRAWINGS

In the course of the following detailed description, reference will be frequently made to the accompanying drawings in which like reference numbers refer to like parts and in which:

FIG. 2A is an enlarged detail view of area a of FIG. 2, illustrating the other exposed free ends of the wire contacts of the connector;

FIG. 3A is a top plane view of a frame member used in the connectors of FIG. 1;

FIG. 3B is a cross-sectioned view of a portion of the frame member of FIG. 2A, taken along line B—B thereof;

FIG. 3C is a cross-sectioned view of a portion of the frame member of FIG. 3A, taken along line C—C thereof;

FIG. 4 is a bottom plan view of the frame member of FIG. 3A;

FIG. 5 is a perspective view of the frame member of FIG. 3A and a fabric substrate in position for insertion into the frame member opening;

FIG. 6A is a top plane view of the connector frame assembly of FIG. 1, with the fabric substrate in place of the support layers molded thereto;

FIG. 6B is a cross-sectional view of a portion of the connector frame assembly of FIG. 6A, taken along line B—B thereof;

FIG. 6C is a cross-sectional view of a portion of the connector frame assembly of FIG. 6A, taken along line C—C thereof;

FIG. 6D is an enlarged detailed view of area D of FIG. 6A;

FIG. 8 is a cross-sectional view of an alternate manner of mounting the fabric substrate to the connector frame;

FIG. 9 is a cross-sectional view of a portion of the connector elastomeric substrate illustrating the fabric reinforcement thereof;

FIG. 10A is a diagrammatic sectional view of a contact stitching tool having a single point used in assembling the connectors with the conductive wire threaded therethrough;

FIG. 10B is a diagrammatic sectional view of the contact stitching tool of FIG. 10A after bending of the wire;

FIG. 11 is a diagrammatic view of the tool of FIG. 10, entering the connector substrate;

FIG. 12 is a diagrammatic view illustrating how the tool of FIG. 10 penetrates the flexible body of the connector and initially advances a predetermined length of the contact wire;

FIG. 13 is a diagrammatic view illustrating the tool being removed from its penetration through the connector flexible body;

FIG. 14 is a diagrammatic view of the tool withdrawing from near the surface of the connector flexible body while paying out the contact wire from the tool into a position ready for trimming;

FIG. 15 is a diagrammatic section of a view illustrating the contact wire in place within the connector flexible body and severed from the wire supply and the insertion tool;

FIG. 19C is a detailed cross-sectional view of a portion of a connector of the invention with the insertion tool of FIG. 19A inserted partially therein to;

FIG. 20 is a cross-sectional view of an alternate embodiment of a connector constructed in accordance with the principles of the present invention;

FIG. 21 is a detail view, partly in section, of a body portion for use with the connectors of the invention that has a solid reinforcement member disposed therein;

FIG. 22 is a partial sectional view of a connector body portion in place within the connector and being subjected to a punching member to form openings therein for the connector contacts;

FIG. 23 is a diagrammatic elevational view partly in section of an insertion tool aligned with an opening in the connector body portion of connectors of the present invention;

FIG. 24A is a diagrammatic plan view of FIG. 23 taken along lines 24—24 thereof, illustrating the orientation of parts where round wire is used for the connector contacts;

FIG. 24B is a diagrammatic plan view of FIG. 23 taken along lines 24—24 thereof, illustrating the orientation of parts where rectangular wire is used to form the connector contacts;

DETAILED DESCRIPTION OF THE PREFERRED EMBODIMENTS

Figure 1:
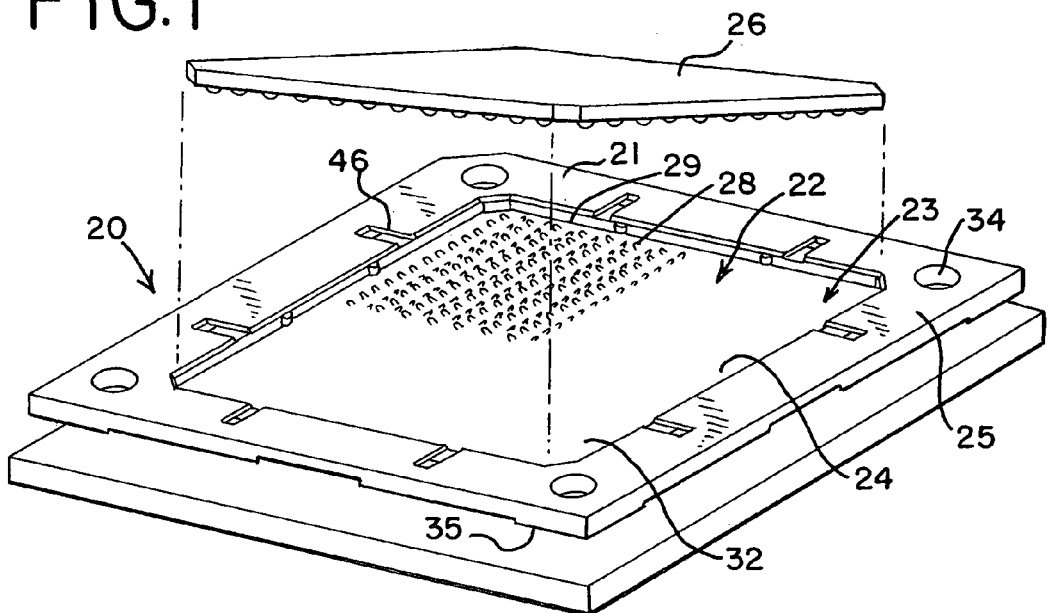
FIG. 1 is a perspective view of an improved LGA connector constructed in accordance with the principles of the present invention with an electronic component aligned with and spaced apart from a nesting recess of the connector.

FIG. 1 illustrates an improved land grid array ("LGA") connector 20 constructed in accordance with the principles of the present invention. The connector 20 includes a frame member 21 that holds, or encloses, a flexible body portion 22 at the connector 20 disposed within an opening 23 of the frame member 21. The body portion 22 of the connector 20 is held within the frame member opening 23 by a plurality of sidewalls 25 of the frame member 21 that surround the opening 23 in a manner such that a top recess 24 may be defined in the top surface of the connector 20, as well as a bottom recess 27, if the particular application of the connector warrants it.

Figure 2:
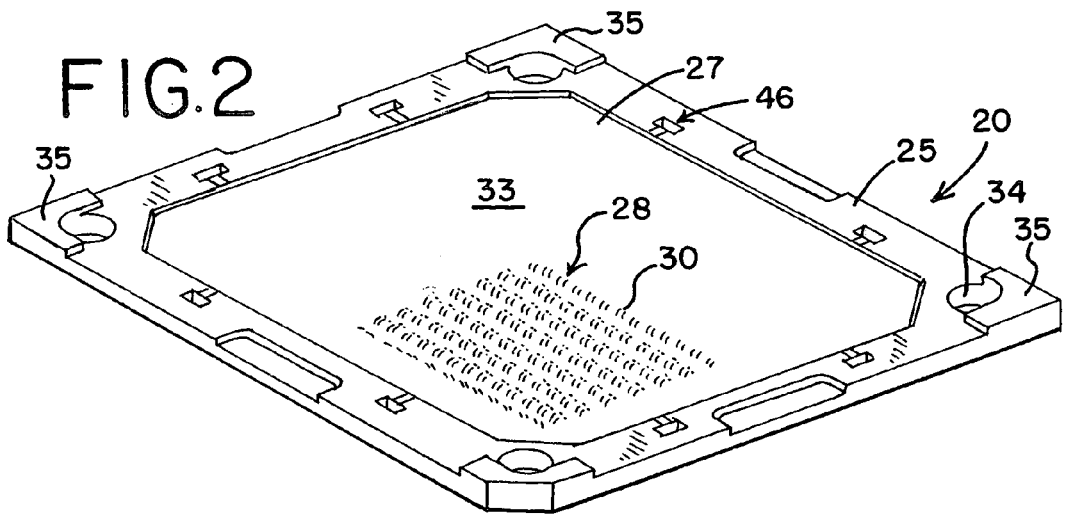
FIG. 2 is a perspective view of the other side (typically the "bottom" side) of the connector of FIG. 1.
Figure 7A:
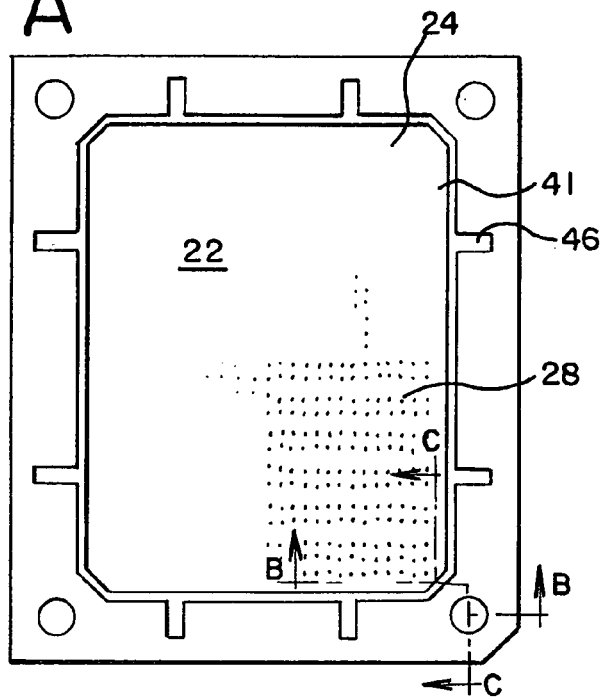
FIG. 7A is a top plane view of the connector frame assembly of FIG. 6A, but with conductive wire contacts in place thereon.
Figure 7B:
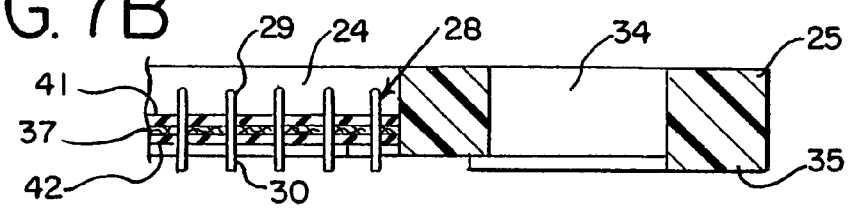
FIG. 7B is a cross-sectional view taken along line B—B of FIG. 7A, illustrating a portion of the connector and further illustrating the wire contacts in their initial orientation within the connector body portion and prior to bending of the wire contacts.
Figure 7C:
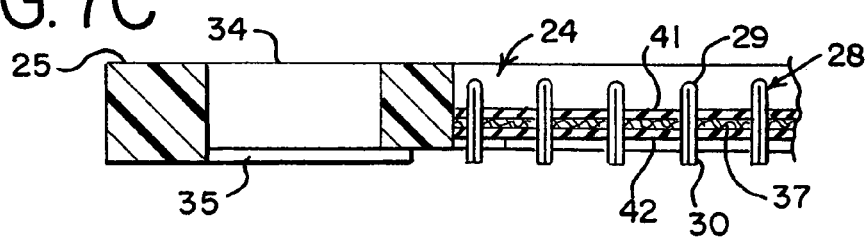
FIG. 7C is a cross-sectional view of the connector of FIG. 7A taken along line C—C thereof.
Figure 7D:
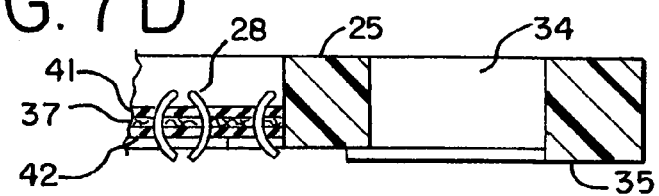
FIG. 7D is a cross-sectional view of the connector of FIG. 7A illustrating one arrangement of the wire contacts within the connector body portion after their bending to orient the contacts in two directions.

It can be seen that the connector 20 is generally rectangular or square in shape, although it will be understood that other configurations may be used. The top recess 24 is adapted to receive therein a circuit component, such as a chip, IC package, ASIC, microprocessor, circuit board 26 or the like, while another similar circuit component may be similarly received on the bottom side of the connector 20 in a lower recess 27. (FIG. 2.) Typically, such a component may include a circuit board that is dimensioned to fit in the lower recess 27, although in some applications, the frame member sidewalls 25 may be formed on the lower side of the connector 20, flush with the lower surface of the connector body portion 22, eliminating any bottom recess, so that the connector 20 may be mounted directly to a circuit board. In order to provide a conductive path between the two circuit components, the connector 20 is provided with a plurality of conductive contacts 28 formed as thin wires, or filaments. These contacts 28 have two free ends 29, 30 that extend upwardly away from the exterior surfaces 32, 33 of the connector body portion 22.

The connector 20, in its application, may be mounted to a circuit board and accordingly, may include one or more mounting holes 34 formed in the frame member 21. Portions of the frame member may be raised with respect to the remainder of the frame member to serve as standoffs 35 (FIG. 2) to slightly elevate the lower surface 33 of the connector body portion 22 and provide a slight air gap between the lower surface and a circuit board (not shown) to which the connector 20 is mounted which can facilitate solder cleaning if the connector is used in a soldered application.

FIG. 3A illustrates the frame member 21 in an open state without the body portion 22 supported therein. The frame member 21 and its sidewalls 25 may be formed in a suitable manner, such as by injection molding from a plastic or other electrically insulative material. The frame member 21 is preferably molded as one piece, although alternate constructions may be utilized. In this embodiment of the invention, a fabric extent 37 (FIG. 5) is used as a reinforcement member to give the body portion 22 some support, and is cut to a predetermined configuration, which preferably matches that of a support shoulder 38 (FIG. 4) that is formed on one of the surfaces of the frame member 21. The fabric extent 37 is preferably formed from a fabric, such as nylon or fiberglass, that is preferably cut to size using a laser or a blanking die. Natural fabrics may be used, but it will be noted that the use of synthetic fabrics for the fabric extent, such as fiberglass, is beneficial in that fiberglass has a very low coefficient of thermal expansion (approaching almost a zero value) which reduces any expansion from occurring in the connector body portion 22 during operation, and it further has better heat transfer capabilities than conventional insulators. The use of a laser in cutting the fabric extent is beneficial in that heat generated by the laser is able to seal the edges of the fabric and minimize any fraying that might occur in the loose ends of the fabric after cutting. Other fabrics, including types of the non-woven type such as felts and knit fabrics may be used as reinforcement members.

The shoulder 38 is illustrated as being formed on the bottom surface (FIGS. 3B, 3C & 4) of the frame member 21. The shoulder 38 is recessed as shown, and extends around the inner perimeter of the frame member 21. This shoulder 38 provides a means for accurately placing the fabric extent 37 in the frame member 21 and also provides a support for the elastomer that is attached to the frame member 21 and the fabric 37. In order to retain the fabric extent 37 in place in the shoulders 38, raised catches, or ribs 40, may be provided along the four sides thereof, which can be used to contact the fabric and hold it taut within the frame member 21 so as to prevent any trampoline effect, or other type of sagging, from occurring during subsequent processes. These ribs 40 may also be used in the heat staking of the fabric extent 37 to the frame member 21. The fabric extent 32 may be placed over the frame member and brought into contact with it and heat applied to the ribs 40, causing them to melt and grip the fabric extent 37 in a manner similar to that known in the art. Although these ribs 40 are illustrated in the center portions of the shoulders 38, they may extend longer than shown to provide additional staking capability. When the elastomer is overmolded to the frame member, the elastomer will retain and capture the loose ends of the fabric extent in that area.

The fabric extent 37 may also be pressed over the ribs 40 during attachment and one of the elastomeric layers 34, typically the one situated on the "top" face of the connector 20, may be molded to the frame member 21 opposite the shoulder 38 and ribs 40. In this description, the term "top" will refer to surface of the connector that receives and opposes the circuit component 26. Once the fabric extent 37 is placed into the frame member 21 and positioned on the shoulder 38, it is preferably permanently secured in place by overmolding, or otherwise applying an elastomer to opposite sides of the frame member 21 and the fabric extent 37.

In another embodiment of the invention, as illustrated in FIG. 21, the reinforcement to the body portion 22 may be provided in the form of a solid film member 337. The solid film member 337 is preferably formed from a polymer film, which does not fray, as may the fabric reinforcement layer at times, which may result in fabric threads clinging to the conductive contacts and possibly affecting the integrity of the connector. Useful results have been obtained by using polyamide (polymer) films sold under the trade name "Kapton" by E. I. DuPont. Such a reinforcement member also differs from the fabric ones discussed above in that it does not have openings between adjacent threads through which the elastomer may flow during formation of the body portion 22.

In one sense of the invention, the elastomer may be considered as two elastomeric layers 41, 42 extend along the top and bottom surfaces 32, 33 of the connector body portion 22. However, it will be understood that the term "layer" as applied to the elastomer is intended to be given its broadest interpretation and hence, will include two separate layers of elastomer or a single structure formed where the elastomer penetrates or passes through the interstitial openings 43 defined between adjacent threads 44 of the fabric or other reinforcement extent 37, 337 to cooperatively form a single structure thereamong. (FIG. 9.) In this manner, where the elastomer covers all of the exposed surfaces of the reinforcement extents 37, 337, the extents 37, 337 are considered to be "encapsulated" within the elastomer, with the elastomer forming the top and bottom surface of the body portion. Alternatively, if the two layers 41, 42 do not flow into each other, but nevertheless bond, or otherwise attach to both themselves and the fabric extent 37 as illustrated in FIG. 9, by contacting each other through the interstitial areas present between adjacent threads of the fabric extent 37, the resulting construction may be considered to be "integrated" with the elastomer, or "sandwiched" between two elastomer layers, with the elastomer extending along the top and bottom surfaces of the body portion. Still further, the elastomer layers 41, 42 may be placed in intimate contact with the opposite sides of the reinforcement extents 37, 337, by subjecting all three of these members to elevated heat and pressure to form what may be considered as a "laminated" construction. Still further, in some applications, the reinforcement extents 37, 337 may be coextruded with two elastomer extents, or they may also be dipped in the elastomer to coat both sides thereof with a "layer".

In order to ensure that a proper bond between the body portion 22 (i.e., the reinforcement extents 37, 337) and the elastomer layers 41, 42 to the connector frame member 21, a series of anchoring cavities 46 may be formed in the frame member 21 at predetermined locations. As shown in the drawing, these cavities 46 may communicate with the frame member opening 23 and extend within the shoulder portion 38 formed in the face of the connector 20. These cavities 46 preferably extend through thickness of the frame member 21 and may include offset cavity portions 51, 52 that are aligned with each other but extend in an offset manner from each other so as to form an opening in the frame that extends in two different directions, which will fill with the elastomer to thereby firmly anchor the body portion 22 to the connector frame member 21. Examples of suitable elastomers include, but are not limited to, solid silicones, silicone foams and rubbers, synthetic rubbers, triblock copolymers and the like. The durometer of the elastomer also contributes to the operation of the body portion with higher durometers being preferred for improved retention of the wires inserted into the body portion openings. For example, it has been found that an elastomer with a durometer of 70 on the Shore A Scale provides better wire retention than one with a Shore A durometer of 40.

When so filled with the elastomer, these anchoring cavities 46 and their offset portions 51, 52 will engage the frame member sidewalls in two different directions to provide a suitable anchoring in addition to any natural adhesive properties the elastomer may have. The alignment of these offset cavity portions 51, 52 is best shown in FIGS. 3B and 6A, while the manner in which the elastomer fills them is best shown in the sectional view of FIG. 6C. These cavities 46 serve to provide a means for interlocking the elastomer layers 41, 42 to the frame member 21, or as anchors as to each other when the layers 41, 42 are formed simultaneously on the frame member 21. These anchoring cavities 46 are best filled with the elastomer is applied to the fabric extent 37 after attachment to the frame member 21, by way of a suitable overmolding process.

In an alternate anchoring and fabric-capturing construction, as illustrated in FIG. 8, the frame member 21 may have a channel, or filling groove 100, formed therein that may extend around the entire perimeter of the connector frame opening. This channel 100 receives the ends or edges 101 of the fabric extent 37 and when the elastomer is applied to thereto, the elastomer portion on the lower side of the connector will fill the channel 100 and force the fabric edges 101 into it to provide a taut, but flexible body portion of the connector.

The inner edges 54 of the frame member 21 may be chamfered as illustrated in FIG. 5 at 55, so as to increase the surface area thereof to provide more area in the elastomer to contact and adhere to as it is molded or poured into the frame opening 23. The two elastomer layers 41, 42 serve to encapsulate ends of the fabric extent 37 and to cover the exposed surfaces thereof, while the fabric extent provides reinforcement to the elastomer layers 41, 42 and gives it a measure of tautness. The fabric 37 also serves to partially support the wires inserted into the body portion 22 and the elastomer resiliency further holds the contacts 28 in place and provides a sealing action around the wires of the contacts. It is contemplated that the fabric extent and elastomer layers may also be separately formed, subsequently attached to each other and then assembled into the connector frame after its forming.

The use of the elastomer and the fabric extent (or other reinforcing member) complement each other in the use of the invention, for while the elastomer provides flexibility to the body portion of the connector, the fabric provides reinforcement and a measure of rigidity to the flexible body portion that supports the contacts so as to reduce the overall thickness of the connector body portion that supports the contacts, and thereby achieve the shortest possible mating height for the connector 20. In this regard, it is believed that thicknesses of about 0.5 mm may be achieved for the body portion 22 when sandwich, encapsulation and coextrusion types of body portion construction are used wherein the fabric extent 37 has an elastomeric layer 41, 42 applied to both sides thereof. Where the fabric used in the extent 37 has a thickness of about 0.15 mm and the elastomer layers each have a similar thickness, the resulting aggregate thickness of the body portion is about 0.45 mm.

Insofar as the overall mating height of the connector 20 is concerned, it is believed that it is possible to achieve with the invention, free ends 29, 30 of the contacts 28 that project past the exterior surfaces 32, 33 of the body portion 22 a distance of about 0.25 mm, thus giving an expected total body portion mating height (obtained by adding the lengths of the contact free ends 29, 30 to the thickness of the body portion 22) of about 0.95 mm. In such instances, the connector frame member 21 may have a thickness of only about 1.5 mm, thereby creating an extremely thin, but high-density connector that has low insertion forces. As mentioned above, it is also contemplated that the elastomer 41, 42 may be applied to only one of the two surfaces of the fabric extent, or vice-versa, thereby further reducing the eventual thickness of the mating area of the connector 20. The type of fabric may also influence the eventual thickness of the body portion. A fabric extent having a uniform weave will create a homogenous body portion and improve the consistency of the body portion. A random weave fabric may be used that reduces the thickness of the connector body portion.

In another important aspect of the invention and as diagrammatically illustrated in FIGS. 10–15, the conductive contacts 28 are inserted into body portion 22 by "stitching" them in place. The contacts 60 are inserted into the body portion 22 of the connector preferably by a programmable sewing machine 20 that employs a reciprocating, stitching motion. An extent of conductive wire 63 is incrementally fed through the center passage, or lumen, 62 of an insertion tool 61 prior to entering the body portion 22. (FIG. 10A.) The wire 63 is exited from the center of the tool and is advanced prior to insertion, so that the elastomer layers 41, 42 will grab the wire 63 and keep a portion (i.e., a free end 30) of it projecting past the lower surface. (FIG. 11.)

Depending on the wire diameter, the backward movement of the needle may be sufficient to bend the wire upon itself to define a free end 29 that has a looped double strand 65 as illustrated in FIG. 1D. However, it is preferred that this bending be performed by a wire gripping means 67 disposed on the relevant side of the connector body portion 22. As shown in FIG. 10B, the bending may be performed on the wire 63 by the gripping means 67 prior to insertion of the tool 61 into the flexible body portion 22. Further movement of the insertion tool 61 (FIG. 12) through the body portion 22 (and the fabric layer 37 and the other elastomer layer) while the wire 63 is advanced will cause the wire to extend past the opposite exterior surface 33 of the other elastomer layer 42. Once the preselected extent of this wire 63 is reached to form the desired length of contact, the insertion tool 61 is then withdrawn back through the body portion 22. (FIG. 23.) As the insertion tool 61 is withdrawn past the upper elastomer layer, the wire 63 continues to be advanced so that on this side of the connector two free strands 30 of the wire are presented in side-by-side order. The so-advanced strand is then cut by a suitable means 68 at a distance substantially equal to that of the other strand. (FIG. 14.) Alternatively, the wire may be advanced from the tool prior to insertion and then bent alongside the tool so that it will move in synchronization with the movement of the tool.

Figure 17:
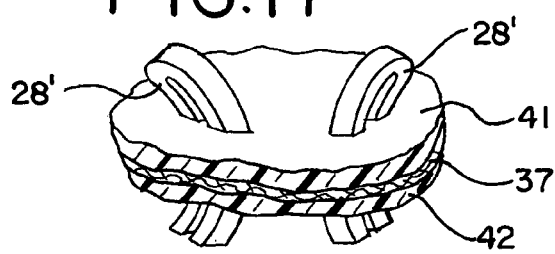

This stitching method permits the connector 20 to be made with the contacts on very small pitches with a low height and profile. The contacts 28 may be formed from either lengths of round wire 63, or as illustrated in FIG. 17, lengths of polygonal cross-section wire, such as rectangular, square, hexagonal or the like may be used with the most noticeable benefit being the increased electrical load that the contacts 28 of the connector 20 can carry. Also, when the wire has a non-circular configuration, such as a rectangular cross-section of about 0.1 mm by 0.25 mm, the non-circular wire will resist the tendency for the elastomer to turn the wire 90° due to the elastomer exerting an outer pressure on the wire. When rectangular wire is used, it is preferably folded upon itself on the major dimension of the cross-section. As previously stated, the contacts 28 may be stitched into the body portion 22 with a programmable sewing machine that can selectively insert the wires in a predetermined pattern. The pattern may be adjusted by way of the programing aspect of the sewing machine, i.e., software, rather than adjusting the mold cavity as would be done with a conventional molded connector.

The reciprocal motion of the insertion tool, or needle/tube 61, and the bending of the wire creates an open-ended, dual strand conductive loop for each contact 28, with each strand or "leg" of the wire forming an independent circuit path between contacts on the chip 26 and the other component to which the connector 20 is mounted. This dual strand, open loop contact includes two ends 29, 30 that project past the exterior surfaces of the flexible body portion 22. One end 29 of the contact may be considered as the "loop" end of the contact because it contains the end where the wire 63 is bent upon itself, (typically upon a radius in instances where the wire is round wire) while the other end 30 of the contact may be considered as the "open" end of the contact because the two strands of wire terminate in free, unconnected ends. This dual strand extent is beneficial because it not only provide redundant circuit paths to ensure the validity of the connection provided by the connector 20, but also reduces the inductance of the overall system in that each of the contact's generally parallel circuit paths will reduce the inductance of the specific contact by approximately one-half as compared to the use of only a single contact as demonstrated by the parallel inductance equation: $L_{TOT}=(L_1 \times L_2)/(L_1+L_2)$. Additionally, the free ends 29, 30 of the contacts 28 are small, but provide high contact pressure even though the connector requires only a small normal loading force to achieve a reliable interconnection and to provide effective Hertzian contact with an opposing circuit component. The cut free ends 30 (FIG. 18) of the contacts 28 have in effect, knife edges, formed thereon that can dig into the contact pads on opposing circuit boards or chip packages to break through any contamination or oxidation that may form on the components. It is also contemplated that if necessary, solder balls 125, 126 may be added to one or both of the free ends 29, 30 of the contacts 28 as shown in FIG. 20.

The preferred manner of insertion is shown diagrammatically in FIG. 23. Each opening formed in the connector body portion may be considered as having a centerline CA as shown in FIG. 23. The insertion tool has its own centerline TA which for the most part, coincides with the centerline WA of the wire being fed through the tool. Because the wire is bent upon itself to form a loop, the insertion tool is oriented at an offset OC from the opening centerline as illustrated. FIGS. 24A and 24B respectively illustrate this offset in a sectional view as well as the placement of the wire (both round and rectangular) and the tool with respect to the openings of the connector body portion.

In an alternate manner of wire insertion, holes for receiving the contacts 28 may be formed in the body portion 22 by burning them in with a laser, which will prevent loose parts or shreds of the fabric from extending through the hole and forming debris on either surface of the connector body portion 22 as a result of insertion. The laser will also reduce the amount of force required to penetrate the body portion when the holes are preformed in body portions that utilize a film reinforcement member 337. Similarly, as illustrated in FIG. 22, a punching member 400 may be used to sequentially pre-punch holes 401 in the connector body portion 402, penetrating through both the elastomer portion 403 and the reinforcing member 404. Contacts are then inserted into the holes by the insertion tool described above.

Figure 27:
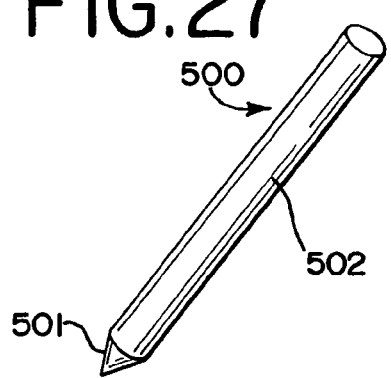
FIG. 27 is a perspective view of a punching tool that may be used with the methods of the invention to pre-punch, or pierce openings in the connector body portion.
Figure 28:
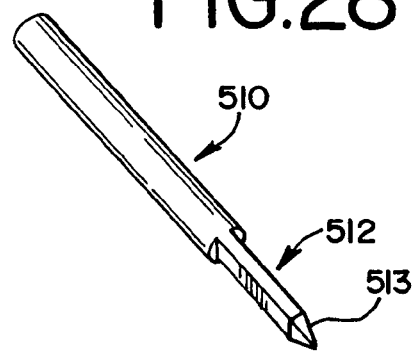
FIG. 28 is a perspective view of an alternate punching tool that may be used with methods of the invention; and, FIG. 29 is a sectional view of another alternate embodiment of the invention.

FIG. 27 illustrates one style of punch 500 that has a conical portion 501 formed on the tip of its elongated body portion 502. FIG. 28 illustrates an alternate style of punch 510 where the body portion 511 terminates in a knife end 512 that has a square or rectangular piercing head 513. Either of these tools will preform suitable openings in the connector body portion 22, with the tool 500 forming circular-type openings and the knife punch 510 forming slits in the connector body portion 22. Pre-piercing the connector body portion offers advantages such as reduced debris and improved wire loop straightness when a polyamide reinforcement film is used with the connector body portion.

Of importance in the present invention is the contact force aspect that the open loop construction of the wire contacts give to connectors that utilize them. Not only are redundant, conductive circuit paths established in each contact, but the closed ends 29 of the open loops each have a radius occurring where the wire is bent upon itself, which results in a point contact P (FIG. 1A) being established between the closed end portion 29 of the contact 28 and an opposing circuit component. On the opposite side of the contact, where the contact free end is composed of two, adjacent free ends of the wire, as shown in FIG. 2A, the contact effected with an opposing circuit component will be a line contact, with the line occurring along one of the cut edges of the wires, shown in FIG. 2A as the bolded line H, especially in instances where the wire cross section is either square or rectangular.

Figure 1A:
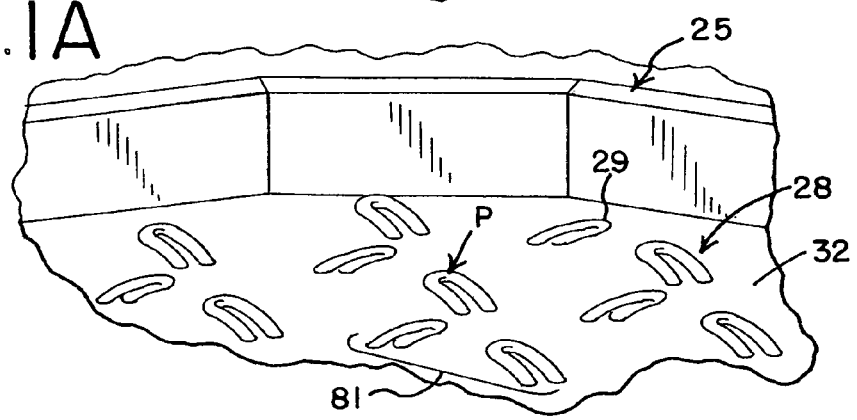
FIG. 1A is an enlarged detail view of area a in FIG. 1 illustrating the exposed free ends of the wire contacts of the connector.
Figure 16:
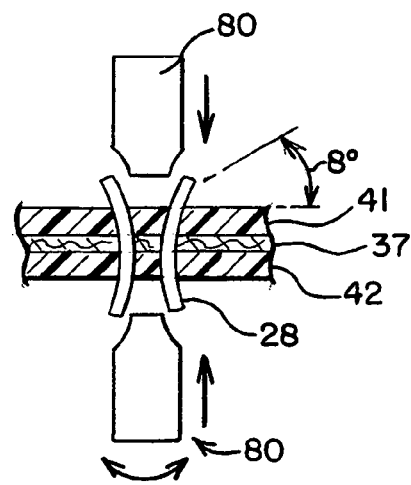
FIG. 16 is a diagrammatic view of a contact free end-forming member brought into contact with the contacts after insertion into the body portion; and, FIG. 17 is a detailed view of wires used as contacts which have a non-circular cross-section.
Figure 18:
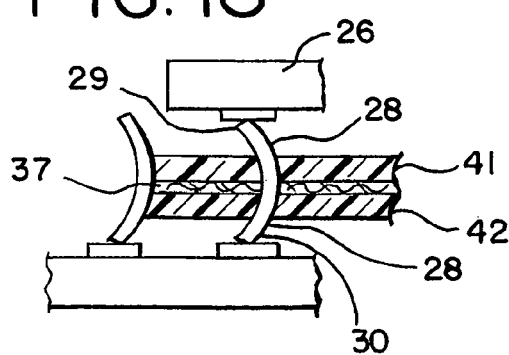
FIG. 18 is a detailed sectional view of a portion of the connector of FIG. 1, in place between a chip and a circuit board, illustrating the manner of conduct effected by the connector contacts.

The process of making the connectors 20 may also include, as illustrated in FIG. 16, a forming tool, such as a mandrel 80 that comes down into contact with the contact free ends 29, 30 on opposite sides of the connector to form the free ends 29, 30 in one or two directions. The mandrel may be formed with symmetrical sides as shown and moved in an arc or similar movement along the arrow M of FIG. 16 to form the wire ends in the manner shown, where pairs of adjacent contacts have their free ends directed away from each other. The end result of this type forming is shown in FIGS. 1A and 2A, wherein pairs 81 of contacts 28 are formed so that they point toward each other at an angle. An alternate arrangement is illustrated in FIG. 16 where the mandrel 80 contacts the free ends 29 of a pair 81 of contacts 28 and bends there free ends 29 toward the body portion surface 33 at an angle that is less that 90 degrees, but in opposite directions from each other. Yet another arrangement is illustrated in FIG. 18 where pairs of contacts 81 point in the same direction.

Figure 19A:
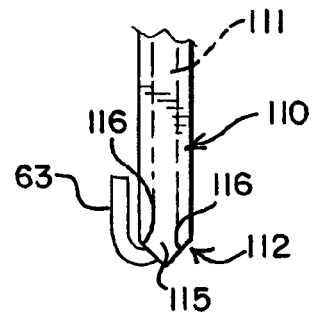
FIG. 19A is a side view of an alternate construction of an insertion tool that may be used to insert the conductive wires into the flexible body portions of the connectors of the invention
Figure 19B:
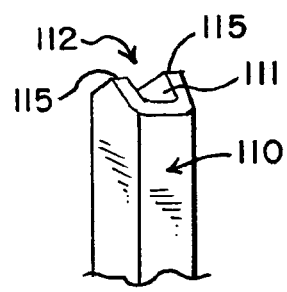
FIG. 19B is a perspective view of the tip end of the insertion tool off FIG. 19A.
Figure 19C:
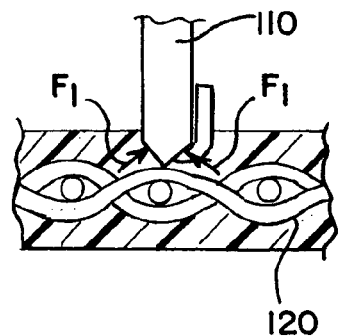

FIGS. 19A–C illustrate another construction of an insertion tool 110 that may be used in making of the connectors of the invention. Although the single insertion tool shown in the drawings are suitable for inserting the contacts, at times it has been discovered that the elastomeric body portion 22 of the connector 20 tends to exert a slight force on the angled surface of the insertion tool 61, increasing the likelihood of the tool 61 "walking" into the elastomer and slightly off the center of the intended insertion location in the flexible body portion 22. In order to alleviate the likelihood of this occurring, a dual point insertion tool 110 may be used for inserting the contacts 28 into the flexible body portion 22 of the connector 20.

As seen best in FIG. 19B, the tool 110 takes the form of a hollow needle, or tube, with a central passage extending axially therein that opens to the exterior at the tip end 112 thereof. Two points 115 are formed at the tip end 114 and are spaced apart from and aligned with each other. Each such points 115 has a triangular configuration with two slanted sides 116 on opposite ends of a centerline of each point 116. The passage opens up at the center of the tip end 112 although it may be slightly recessed back from the tip end 112 as shown so that the wire 63 exits therefrom in the manner illustrated.

FIG. 19C illustrates the penetration of the tool 110 into an elastomer part of the body portion 22. The "walking" tendency referred to above is not likely to occur with this construction because the elastomer will offer a resistance force $F_1$ on each angled face 116 of the tool tip end 112, thereby keeping the tool 110 in line so that it may penetrate the elastomer in its designated spot, and even directly through any reinforcement threads beneath it. These two forces are believed to counteract each other and keep the tool 110 on its path into and through the elastomeric body portion and through any threads that may lie in its path.

Figure 25:
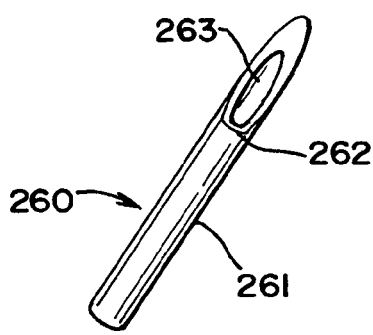
FIG. 25 is a perspective view of an alternate embodiment of a wire insertion tool that may be used in the methods of the invention.
Figure 25A:
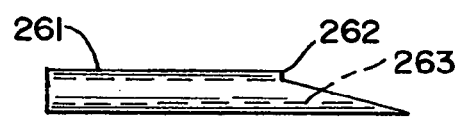
FIG. 25A is an elevational view of the insertion tool of FIG. 25.
Figure 26:
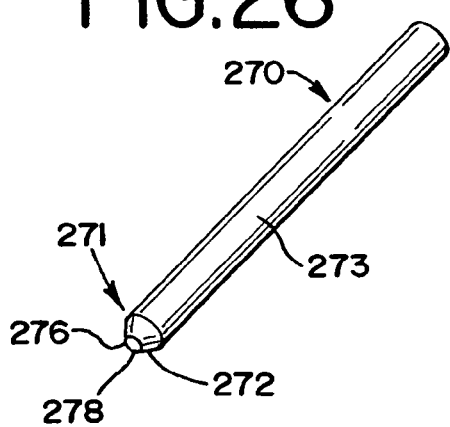
FIG. 26 is a perspective view of an alternate embodiment of a wire insertion tool that may be used in the methods of the invention.

FIGS. 25 and 26 illustrate types of insertion tools. In FIG. 25A, it can be seen that the tool 260 has a wedge shape in that a portion of its body 261 is sliced at an angle from an initial transverse cut in the body 260 that forms a stepped surface 262 at the end of the slice. The angled profile of the tool 260 increases the size of the opening of interior passage 263 of the tool.

Figure 26A:
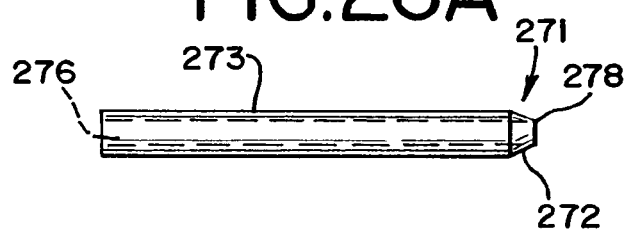
FIG. 26A is an elevational view of the insertion tool of FIG. 26.

FIGS. 26 and 26A illustrates another tool 270 that has a "bullet"-shaped nose 271 formed at the tip end 272 of the tool body 270. This bullet shape is easily obtained by transversely slicing, or truncating, a conical end of the nose 271. In this manner, a sharp circular tip 275 that surround the tool interior passage 276 is formed that will contact the connector body when the insertion tool is pushed against it.

Although it is preferred that the flexible body portion 22 of the connector 20 use a fabric reinforcement layer, the benefits of the present invention may also be obtained in connector structures that use only an elastomeric extent for the flexible body portion. FIG. 20 illustrates, in cross-section, a connector 200 having a rigid frame member 202 with an opening 204 that receives an elastomeric body portion 206. Without any reinforcement layer, the body portion 206 is maintained in its position within the opening 204 by way of the anchoring cavities described above and as illustrated in FIG. 6D. The body portion 206 contains a plurality of individual conductive contacts 28 that are arranged therein in a predetermined pattern, or array. Each contact 28 includes at least two strands of thin wire 63 that extend above the opposite exterior surfaces 214, 215 of the body portion in a fashion similar to that described above.

Figure 29:
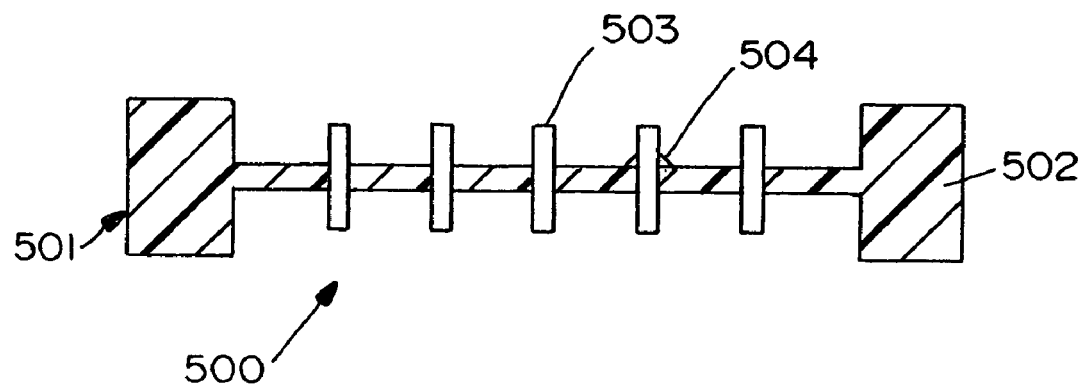

Although much of the prior description has been focused on the use of a flexible body portion that uses an elastomeric material, the present invention also contemplates using its unique stitching aspect to insert contacts in a more rigid body portion. FIG. 29 illustrates a connector 500 having a housing 501 and body portion 502 supported by the housing. In some instances, the housing 501 and body portion 502 may be one and the same component. In other instances, the body portion may be a thinner portion or a film such as the Kapton film mentioned above. Holes may be either drilled, cut, punched or burned (by a laser) in the body portion and conductive contacts 503 inserted therein using the stitching insertion process illustrated in FIGS. 10–15 and 23. In some instances it may be necessary to secure the contacts 503 in their openings by means of an adhesive 504. As with the prior process, the contacts 503 may be either formed from conductive wire or may be previously formed contacts, such as stamped and formed contacts.

With the use of "stitching" to insert the contacts into the body portion, it will be appreciated that the invention is not limited to the use of a single needle. Rather, an array or "gang" of needles may be used in order to perform multiple contact insertions in a single movement of the insertion tool.

While the preferred embodiment of the invention have been shown and described, it will be apparent to those skilled in the art that changes and modifications may be made therein without departing from the spirit of the invention, the scope of which is defined by the appended claims.

What is claimed is:

1. A method of making a pressure contact connector, comprising:
providing a frame member having an opening disposed therein;
providing an extent of film with predetermined dimensions and having opposing first and second surfaces;
forming a body portion of the connector within the frame member by mounting the film extent to said frame member;
forming a plurality of conductive contacts in the body portion by inserting a plurality of thin conductive wires into said film extent in a predetermined pattern, each of the contacts having opposing first and second free ends that extend past said first and second surfaces of said body portion to form a plurality of conductive paths through both said film extent and said body portion; and,
forming solder balls on one of said first and second free ends of each of said contacts.

2. The method of claim 1, wherein said frame member has a thickness greater than a thickness of said body portion so as to define at least one component-receiving recess on said connector.

3. The method of claim 1, wherein said film extent is mounted to said frame member prior to forming said contacts in said body portion.

4. The method of claim 1, wherein said step of forming said contacts in said body portion includes the steps of:
bending said wires upon themselves to form lengths of double-stranded wires; inserting said double-stranded wires into said body portion to embed said double stranded wires into said body portion.

5. The method of claim 4, further including the step of passing said wires through a hollow insertion tool that is sequentially inserted through and removed from said substrate and cutting said wires to define said contact opposing first and second free ends thereof.

6. The method of claim 1, wherein said step of forming said contacts in said portion includes the steps of: (A) advancing from a wire supply, a length of wire through an insertion tool; (B) bending said wire length upon itself to form a double-strand wire length; (C) inserting said double-strand wire length into said body portion to embed said double-strand wire length in said connector body portion; (D) cutting said wire to free said double-strand wire length from said wire supply and define said contact opposing first and second ends; and, (F) repeating steps (A) through (D) to insert subsequent contacts into said body portion.

7. The method of claim 6, wherein said double strand wire length are inserted into openings of said body portion on opposite sides of centerlines of said openings.

8. The method of claim 1, wherein said wires are inserted into said body portion by stitching.

9. The method of claim 1, wherein said film extent is a polyamide film.

10. The method of claim 1, wherein said film extent is made from Kapton film.

11. The method of claim 1, further including the step of applying an adhesive to one of said first and second surfaces of said film extent.

12. The method of claim 1, further including the step of forming openings in said film extent prior to inserting said wires into said film extent.

13. The method of claim 1, further including the step of forming solder balls on the other of said first and second free ends of each of said contacts.

14. A method of making a land grid array (LGA) connector, comprising:
providing a frame member having a plurality of side walls that cooperatively form an opening within the frame member;
inserting a film extent into said opening, said film extent having two exposed surfaces within said opening on opposite sides of said frame member;
inserting a plurality of conductive contacts in said film extent in a predetermined array wherein each contact has first and second ends that project past said film extent exposed surfaces; and,
applying solder balls to one of said first and second ends of each of said contacts.

15. The method of making an LGA connector of claim 14, wherein said contacts are inserted into said connector by stitching them into said film extent.

16. The method of making an LGA connector of claim 14, wherein said contact-inserting step includes the steps of feeding an extent of conductive wire through a hollow insertion tool, bending said wire extent upon itself and forming a loop at an end of said wire extent, thereby defining a dual strand, open loop wire contact, inserting said insertion tool into said film extent such that the wire loop projects past one of said film extent exposed surfaces and subsequently withdrawing said insertion tool from said film extent.

17. The method of making an LGA connector of claim 14, wherein each of said contacts includes a length of conductive wire folded upon itself to define a first contact end having an end loop, and a second contact end opposite said first contact end, the second contact end having a pair of free ends.

18. The method of making an LGA connector of claim 14, further including the steps of bending said length of wire upon itself to form an end loop in said wire, and inserting said wire, end loop first into said film extent.

19. The method of making an LGA connector of claim 14, further including the step of bending said contact first and second ends of pairs of contacts toward each other.

20. The method of making an LGA connector of claim 14, wherein said film extent is formed from a polyamide film.

21. The method of making an LGA connector of claim 14, wherein each of said dual strand wire contacts is inserted into a corresponding opening in said body portion and said dual strands are disposed on opposite sides of associated centerlines of said openings.

22. A method of making a pressure contact connector, comprising:
providing a frame member having an opening disposed therein;
providing an extent of film with predetermined dimensions and having opposing first and second surfaces;
forming a body portion of the connector within the frame member by mounting the film extent to said frame member;
forming a plurality of conductive contacts in the body portion by inserting a plurality of thin conductive wires into said film extent in a predetermined pattern, each of the contacts having opposing first and second free ends that extend past said first and second surfaces of said body portion to form a plurality of conductive paths through both said substrate and said body portion.

* * * * *